United States Patent
Jhuan et al.

(10) Patent No.: US 12,090,527 B2
(45) Date of Patent: Sep. 17, 2024

(54) METHOD AND SYSTEM FOR PROCESSING SUBSTRATE IN SEMICONDUCTOR FABRICATION

(71) Applicant: Taiwan Semiconductor Manufacturing Co., Ltd., Hsinchu (TW)

(72) Inventors: Chun-Syuan Jhuan, Hsinchu County (TW); Ming-Jung Chen, Hsinchu (TW); Shao-Yen Ku, Hsinchu County (TW); Tsai-Pao Su, Pingtung County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 245 days.

(21) Appl. No.: 16/909,023

(22) Filed: Jun. 23, 2020

(65) Prior Publication Data
US 2020/0316654 A1  Oct. 8, 2020

Related U.S. Application Data

(62) Division of application No. 14/725,258, filed on May 29, 2015, now Pat. No. 10,780,461.
(Continued)

(51) Int. Cl.
*H01L 21/02* (2006.01)
*B08B 3/04* (2006.01)
*H01L 21/67* (2006.01)

(52) U.S. Cl.
CPC .......... *B08B 3/04* (2013.01); *H01L 21/02057* (2013.01); *H01L 21/67017* (2013.01); *H01L 21/67051* (2013.01)

(58) Field of Classification Search
CPC ....... H01L 21/00–86; H01L 21/02041–02101; H01L 21/67017–67086; B01F 21/00–35/95
See application file for complete search history.

(56) References Cited

U.S. PATENT DOCUMENTS 5,722,441 A * 3/1998 Teramoto .................. B08B 3/10
257/E21.228
6,851,436 B1  2/2005 Ravkin et al.
(Continued)

FOREIGN PATENT DOCUMENTS

JP  2000131228 A  *  5/2000
JP  2001269633 A  * 10/2001
(Continued)

OTHER PUBLICATIONS

Siddiqui et al, "A study of hydrogen peroxide decomposition in ammonia-peroxide mixtures (APM)," 102 Microelectronic Engineering 68-73 (2013), available at https://www.sciencedirect.com/science/article/pii/S0167931712001384 (Year: 2013).*
(Continued)

*Primary Examiner* — Mikhail Kornakov
*Assistant Examiner* — Richard Z. Zhang
(74) *Attorney, Agent, or Firm* — McClure, Qualey & Rodack, LLP

(57) ABSTRACT

A method of processing a substrate in semiconductor fabrication is provided. The method includes supplying a mixture from a storage module to a chamber via an inlet conduit. The method further includes detecting the concentration of a substance in the mixture. The method also includes dispensing the mixture over a substrate disposed in the chamber. In addition, the method includes supplying a supply solution including the substance to the chamber via the inlet conduit and dispensing the supply solution over the substrate when the concentration of the substance in the mixture is
(Continued)

less than a desired value. The supply solution is supplied to the inlet conduit at a first position that is at a portion of the inlet conduit extending in the chamber.

20 Claims, 8 Drawing Sheets

Related U.S. Application Data

(60) Provisional application No. 62/162,200, filed on May 15, 2015.

(56) References Cited

U.S. PATENT DOCUMENTS

| | | | |
|---|---|---|---|
| 8,491,726 B2 | 7/2013 | Kamikawa et al. | |
| 2006/0089280 A1* | 4/2006 | Vos | C11D 3/3947 |
| | | | 510/175 |
| 2007/0109912 A1* | 5/2007 | Urquhart | G05D 11/138 |
| | | | 366/136 |
| 2009/0159105 A1* | 6/2009 | Keigo | H01L 21/67253 |
| | | | 134/57 R |
| 2011/0056913 A1 | 3/2011 | Mayer et al. | |
| 2011/0073489 A1* | 3/2011 | Hayamizu | G03F 7/423 |
| | | | 204/252 |
| 2013/0048609 A1* | 2/2013 | Ito | B08B 3/08 |
| | | | 118/712 |
| 2014/0290859 A1 | 10/2014 | Kobayashi et al. | |

FOREIGN PATENT DOCUMENTS

| | | | | |
|---|---|---|---|---|
| KR | 20120016954 | * | 2/2012 | H01L 21/67017 |
| TW | 200930469 | | 7/2009 | |
| TW | 201205652 | | 2/2012 | |

OTHER PUBLICATIONS

Chinese language office action dated Aug. 1, 2016, issued in application No. TW 104139875.

\* cited by examiner

METHOD AND SYSTEM FOR PROCESSING SUBSTRATE IN SEMICONDUCTOR FABRICATION

CROSS REFERENCE TO RELATED APPLICATIONS

This application is a Divisional of U.S. application Ser. No. 14/725,258, filed on May 29, 2015, now U.S. Pat. No. 10,780,461, which claims the benefit of U.S. Provisional Application No. 62/162,200, filed on May 15, 2015, hereby incorporated by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of the semiconductor devices, various processing steps are used to fabricate integrated circuits on a semiconductor wafer. Generally, the processes include coating a photoresist on the semiconductor wafer followed by a soft bake process. When the soft bake process is performed, the chemical properties of the photoresist struck by radiation change in a manner that depends on the type of resist used.

Although existing methods and devices for operating the processing steps have been generally adequate for their intended purposes, they have not been entirely satisfactory in all respects. Consequently, it would be desirable to provide a solution for the process control for semiconductor manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 5-1 shows a schematic view of a system for processing a substrate, in accordance with some embodiments.

FIG. 6-1 s a schematic view of a system for processing a substrate, in accordance with some embodiments.

DETAILED DESCRIPTION

Figure 1:
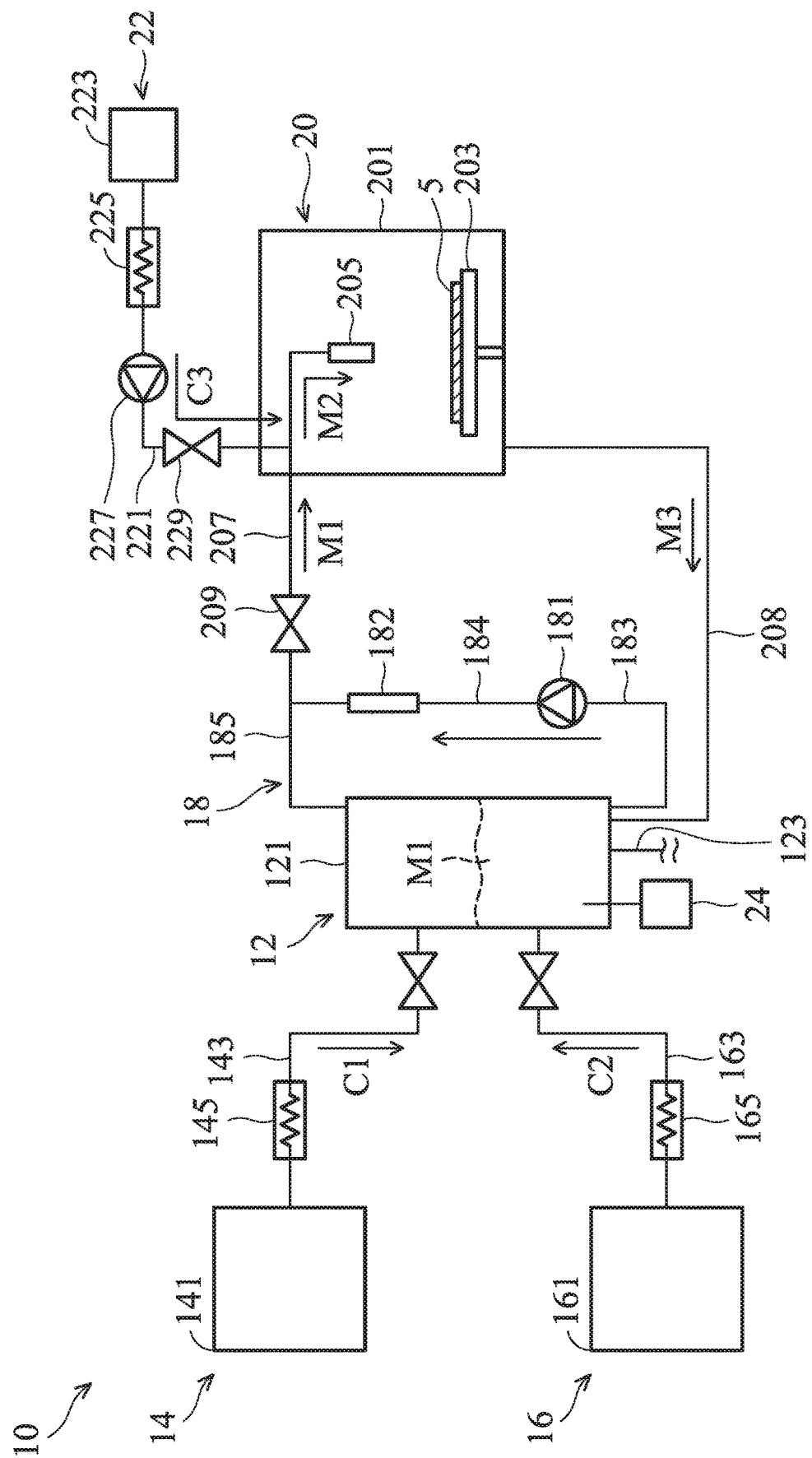
FIG. 1 shows a schematic view of a system for processing a substrate, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

The present disclosure has beneficial utility in preparation of a mixture for cleaning a substrate in the semiconductor fabrication industry. According to some embodiments of the disclosure, one of the purposes of cleaning the substrate is to create a surface that is free from particulate, metallic, and organic contamination. According to some embodiments of the disclosure, one of the purposes of cleaning the substrate is to remove particles from the surface of the substrate by using chemical or mechanical scrubbing. According to some embodiments of the disclosure, one of the purposes of cleaning the substrate is to eliminate metallic ions that have a detrimental effect on device performance. According to some embodiments of the disclosure, one of the purposes of cleaning the substrate is to remove photoresist and polymers left after the etching process. According to some embodiments of the disclosure, one of the purposes of cleaning the substrate is to remove film from the substrate.

FIG. 1 shows a schematic view of a system 10 for cleaning the substrate 5. The system 10 includes a storage module 12, a circulation loop 18, a process module 20, a spiking module 22, and a sensor 24, in accordance with some embodiments of the disclosure. The elements of the system 10 can be added to or omitted, and the disclosure should not be limited by the embodiments.

The substrate 5 may be made of silicon or other semiconductor materials. Alternatively or additionally, the substrate 5 may include other elementary semiconductor materials such as germanium (Ge). In some embodiments, the substrate 5 is made of a compound semiconductor such as silicon carbide (SiC), gallium arsenic (GaAs), indium arsenide (InAs), or indium phosphide (InP). In some embodiments, the substrate 5 is made of an alloy semiconductor such as silicon germanium (SiGe), silicon germanium carbide (SiGeC), gallium arsenic phosphide (GaAsP), or gallium indium phosphide (GaInP). In some embodiments, the substrate 5 includes an epitaxial layer. For example, the substrate 5 has an epitaxial layer overlying a bulk semiconductor. In some other embodiments, the substrate 5 may be a silicon-on-insulator (SOI) or a germanium-on-insulator (GOI) substrate.

The substrate 5 may have various device elements. Examples of device elements that are formed in the substrate 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the storage module 12 includes a storage tank 121 having a relatively large volume and being operable to store a mixture M1 being used in the semiconductor fabrication process. In some embodiments, the storage module 12 further includes an outlet 123 connected to a liquid process system (not shown in figures) to discharge waste mixture M1 from the storage tank 121.

The mixture M1 stored in the storage tank 121 may include an aggregate of two or more substances. Several examples of the mixture are described below.

For example, the mixture M1 stored in the storage tank 121 is a SC1/APM solution mixed with substances including NH4OH, H2O2, and H2O in a selected ratio. The SC1/APM solution may be used to clean the wafer and to remove the organic compound and particulate matter that attaches to the substrate surface. Alternatively, the mixture stored in the storage tank 121 may be a SC2/HPM solution, mixed with a substance including HCl, H2O2, and H2O in a selected ratio. The SC2/HPM solution may be used to clean the wafer and to remove the metal dregs that attach to the wafer surface. However, it should be appreciated that many variations and modifications can be made to embodiments of the disclosure.

In some embodiments, different substances in the mixture M1 are supplied by different material supply assemblies. For example, the mixture M1 includes a first substance, such as H2O2, and a second substance, such as NH4OH. The first substance and a second substance are respectively diluted to a chemical solution C1 and a chemical solution C2 at the desired concentrations and supplied to the storage tank 121 by different material supply assemblies, such as material supply assemblies 14 and 16.

As shown in FIG. 1, the material supply assembly 14 may include a material tank 141 and a material supply line 143. The material tank 141 is used to store the chemical solution C1. The material supply line 143 connects the material tank 141 to the storage tank 121. The chemical solution C1 is supplied to the storage tank 121 via the material supply line 143. The material supply assembly 14 may further include a heater 145 to heat the chemical solution C1 to a predetermined temperature.

The material supply assembly 16 may include a material tank 161 and a material supply line 163. The material tank 161 is used to store the chemical solution C2. The material supply line 163 connects the material tank 161 to the storage tank 121. The chemical solution C2 is supplied to the storage tank 121 via the material supply line 163. The material supply assembly 16 may further include a heater 165 to heat the chemical solution C2 to a predetermined temperature.

It should be appreciated that the number of the material supply assemblies should not be limited to the embodiments mentioned above. The number of material supply assemblies may be varied according to the number of substances in a desired mixture.

The circulation loop 18 is connected to the storage module 12 to operate a circulation process. In some embodiments, the circulation loop 18 includes a pump 181 and a filter 182. The pump 181 is connected to a bottom panel of the storage tank 121 via an upstream conduit 183. The filter 182 is connected to a top panel of the storage tank 121 via a downstream conduit 185. The pump 181 and the filter 182 are connected to each other by a connecting conduit 184.

As a result, by operation of the pump 181, the chemical solutions C1 and C2 added to the storage tank 12 are drawn from the storage tank 12 through the upstream conduit 183, the pump 181, the connecting conduit 184, the filter 182, and back into the storage tank 12 through the downstream conduit 185 along the arrow indicated in FIG. 1. In this manner, the chemical solutions C1 and C2 added to the storage tank 12 are thoroughly mixed to provide a substantially homogenous liquid mixture M1. It should be understood that various other mechanisms known by those skilled in the art for mixing the liquid components in the storage tank 12 may be used as an alternative to the circulation loop 18, as desired.

The process module 20 includes a chamber 201, a substrate stage 203, a nozzle 205, an inlet conduit 207, an outlet conduit 208, and a valve 209, in accordance with some embodiments. The elements of the process module 20 can be added to or omitted, and the disclosure should not be limited by the embodiments.

The substrate stage 203 is disposed in an enclosure space defined by the chamber 201. In some embodiments, the substrate stage 203 is configured for holding, positioning, moving, and otherwise manipulating the substrate 5. The substrate stage 203 is positioned relative to the nozzle 205 so as to allow the process solution from the nozzle 205 to be sprayed on the substrate 5 arranged on the substrate stage 203. The substrate 5 may be secured on a substrate stage 203 by a clamping mechanism, such as vacuum clamping or e-chuck clamping.

In some embodiments, the substrate stage 203 is designed and configured to be operable for translational and rotational motions. In some embodiments, the substrate stage 203 is further designed to tilt or dynamically change the tilt angle. In some embodiments, the nozzle 205 is placed on a movable stage that is scanned across the surface of the substrate 5. In some embodiments, substrate stage 203 is fitted with a suitable heating mechanism to heat the substrate 5 to a desired temperature.

The inlet conduit 207 is connected to the nozzle 205 to deliver the mixture M1 from the storage module 12. In some embodiments, the inlet conduit 207 is connected to the downstream conduit 185 of the circulation loop 18, as shown in FIG. 1. However, it should be appreciated that many variations and modifications can be made to embodiments of the disclosure. In some other embodiments, the inlet conduit 207 is directly connected to the storage tank 121 of the storage module 12, and a pump is connected to the inlet conduit 207 to pump the mixture M1 from the storage tank 12 to the nozzle 205.

The outlet conduit 208 is connected to a bottom panel of the chamber 201 to drain the processed solution M3 from the chamber 201 to the storage tank 121. In some embodiments, the outlet conduit 208 is connected to the storage tank 121 of the storage module 12, and a pump is connected to the outlet conduit 208 to pump the processed solution M3 from the chamber 201 to the storage tank 121, as shown in FIG. 1. However, it should be appreciated that many variations and modifications can be made to embodiments of the disclosure.

The valve 209 is used to regulate the flow of the mixture M1 from the storage tank 121 to the nozzle 205. In some embodiments, the system 10 further includes a host computer to control the valve 209 according to a predetermined setting.

The spiking module 22 includes a branch conduit 221, a spiking material tank 223, a heater 225, a pump 227, and a valve 229, in accordance with some embodiments. The elements of the spiking module 22 can be added to or omitted, and the disclosure should not be limited by the embodiments.

The branch conduit 221 connects the spiking material tank 223 to the inlet conduit 207 of the process module 20. In some embodiments, the spiking material tank 223 is used to store a supply solution C3 including substance contained in the mixture M1. For example, the supply solution C3 in the spiking material tank 223 includes at least one substance that is contained in the chemical solution C1. The concentration of the supply solution C3 may be as same as the concentration of the chemical solution C1. Alternatively, the concentration of the supply solution C3 may be different from the concentration of the chemical solution C1.

The heater 225 is used to heat the supply solution C3 to a predetermined temperature. The pump 227 is used to pump the supply solution C3 from the spiking material tank 223 to the inlet conduit 207. The valve 229 is used to regulate the flow of the supply solution C3 from the spiking material tank 223 to the inlet conduit 207. The valve 209 may be controlled by the host computer of the system 10 in response to a signal produced by the sensor 24.

The sensor 24 is used to detect concentrations of one or more substances in the mixture M1. In some embodiments, the sensor 24 is connected to the storage tank 121 of the storage module 12. The sensor 24 is used to detect the concentration of a particular substance, such as $H_2O_2$, in the mixture M1 stored in the storage tank 121. In some embodiments, the sensor 24 is connected to the storage tank 121 of the storage module 12. The sensor 24 is used to detect the concentration of two or more different substances, such as $H_2O_2$ and $NH_4OH$, in the mixture M1 stored in the storage tank 121. The sensor 24 may be a concentration meter.

Figure 2:
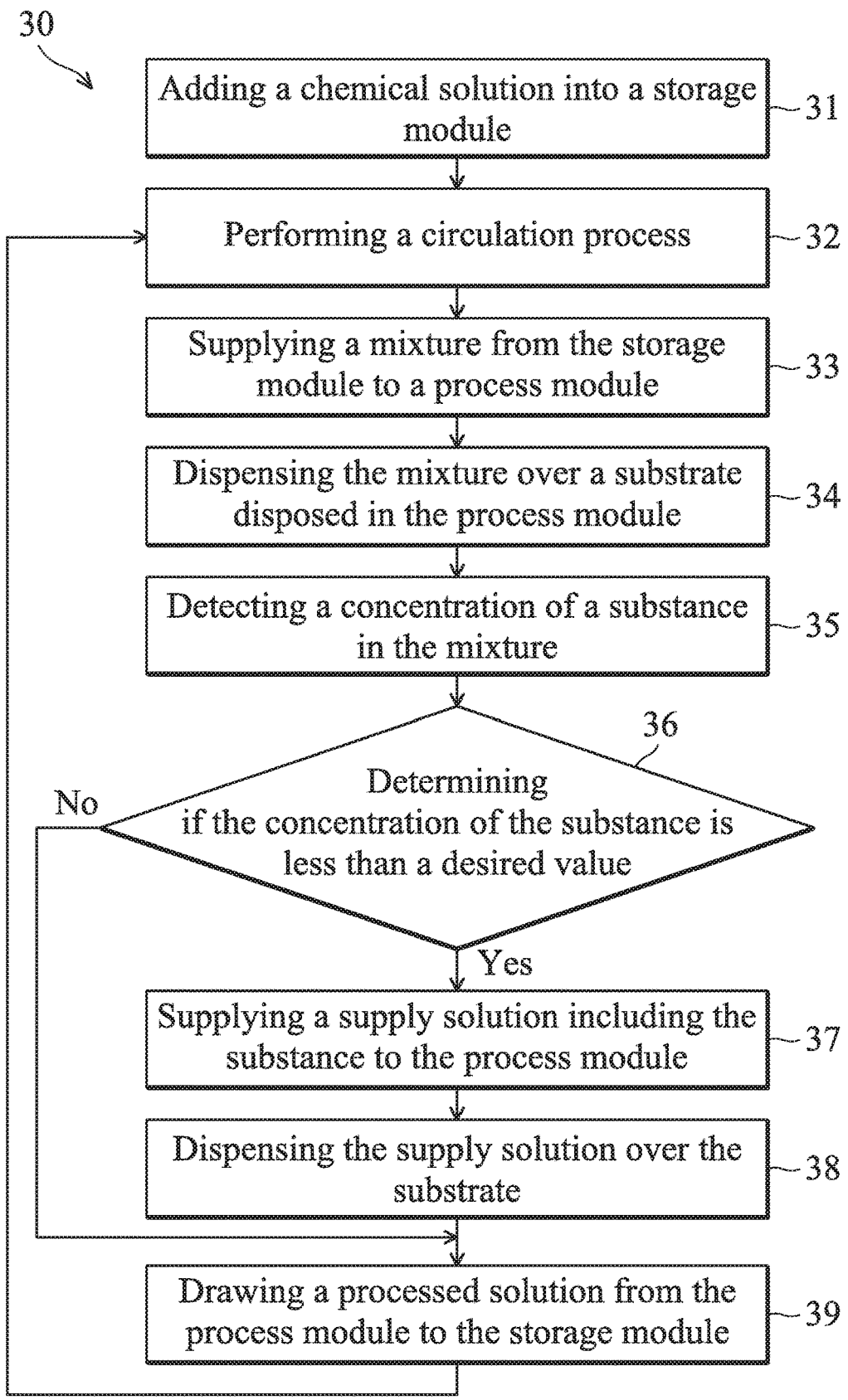
FIG. 2 shows a flow chart showing a method of providing a liquid on a substrate, in accordance with some embodiments.

FIG. 2 is a flow chart illustrating a method 30 for processing the substrate 5 with the system 10, in accordance with some embodiments. For illustration, the flow chart will be described in company with the schematic views shown in FIG. 1. Some of the stages described can be replaced or eliminated for different embodiments. Additional features can be added in the semiconductor device structure. Some of the features described below can be replaced or eliminated for different embodiments.

The method 30 begins with an operation 31 in which one or more chemical solutions (such as chemical solutions C1 and C2) are added to a storage module (such as storage module 12). In some embodiments, the different chemical solutions C1 and C2 are added to the storage module 12 separately. In some embodiments, the different chemical solutions C1 and C2 are added to the storage module 12 at the same time. In some embodiments, before the chemical solutions C1 and C2 are added to the storage module 12, the chemical solutions C1 and C2 are heated by heaters to respective predetermined temperatures. Each of the chemical solutions C1 and C2 may include a substance. For example, the chemical solution C1 is a diluted $H_2O_2$ having a desired concentration, and the chemical solution C2 is a diluted $H_2O_2$ having a desired concentration.

The method 30 continues with an operation 32 in which a circulation process is performed via a circulation loop (such as circulation loop 18). During the circulation process, the chemical solutions C1 and C2 are drawn from the storage tank of the storage module 12 via the circulation loop 18 and back into the storage module 12 for a period of time. In some embodiments, after the operation 32, a substantially homogenous liquid mixture M1 is provided in the storage module 12. In some embodiments, in the circulation process, particles in the mixture M1 are filtered by the filter 182 of the circulation loop 18. In some embodiments, in the circulation process, the mixture M1 in the storage module 12 is heated to a desired temperature for processing. In some embodiments, the operation 32 is continuously operated except that a maintenance process is performed.

The method 30 continues with an operation 33 in which the mixture M1 is supplied from the storage module 12 to a process module (such as process module 20). In some embodiments, the mixture M1 is delivered to the inlet conduit 207 of the process module 20 via the circulation loop 18. The flow rate of the mixture M1 in the inlet conduit 207 is controlled by the pump 181 of the circulation loop 18. In some embodiments, the mixture M1 in the storage module 12 is directly pumped into the inlet conduit 207. The flow rate of the mixture M1 in the inlet conduit 207 is controlled by the pump connected to the inlet conduit 207.

The method 30 continues with an operation 34 in which the mixture M1 is dispensed on a substrate (such as substrate 5) in the process module 20. In some embodiments, the mixture M1 is dispensed from the storage module 12 through the inlet conduit 207 and the nozzle 205 and onto the substrate 5. In some embodiments, the mixture M1 is dispensed on a substantial center of the substrate 5 by the nozzle 205. The substrate stage 203 of the process module 20 simultaneously rotates the substrate 5 at a rotational speed of typically less than about 700 rpm. In some embodiments, the nozzle 205 scans across the surface of the substrate 5, and the mixture M1 is dispensed over the substrate 5. In some embodiments, the operations 32-34 are operated simultaneously.

In some embodiments, some substances in the mixture M1 decay with time while stored in the storage module 12. If the decayed substances are dispensed on the substrate 5, a processing performance of the substrate 5 may degrade. Therefore, a spiking process is performed in this disclosure to add one or more additional substances to the processed module 20, so that the amount of substances dispensed on the substrate 5 is maintained at a desired value.

To determine if the spiking process is initiated, operations 35 and 36 are performed in advance.

In operation 35, the concentration of a substance in the mixture M1 is detected. In some embodiments, a sensor (such as sensor 24) is utilized. The sensor 24 continuously detects the concentration of a substance, such as H2O2, in the mixture M1 stored in the storage tank 121. Afterwards, the sensor 24 sends out a signal according to the concentration of the substance to a host computer of the system 10. In some embodiments, the operation 35 is performed before the operation 34, and the operation 34 is always performed although a detected concentration in operation 35 is less than the desire level.

In operation 36, the detected concentration of the substance is analyzed to determine if the concentration of the substance is less than a desired value. In some embodiments, the host computer of the system 10 analyzes the signal transmitted from the sensor 24 to determine if the concentration of the substance is less than a desired value.

If the concentration of the substance is less than the desired value, the method 30 continues with an operation 37 (i.e. the spiking process) in which a supply solution C3 including the substance is supplied to the process module 20.

In some embodiments, the supply solution C3 is supplied by a spiking module (such as spiking module 22) to the inlet conduit 207 of the process module 20. After the supply solution C3 is added into the inlet conduit 207, an adjusted mixture M2 mixed with the supply solution C3 and the mixture M1 is provided. The concentration of the substance in the adjusted mixture M2 may be equal to or slightly higher or lower than the desired value set in operation 35. In some embodiments, the supply solution C3 is added to the mixture M1 in the process module 20 before the mixture M1 is dispensed over the substrate 5. In some embodiments, the supply solution C3 is not supplied to the process module 20 when the mixture M1 is not supplied from the storage module 12 to the process module 20 although a detected concentration is less than the desire level.

Afterwards, the method 30 continues with an operation 38 in which the supply solution C3 is dispensed over the substrate 5. In some embodiments, the adjusted mixture M2 including the supply solution C3 is dispensed from the inlet conduit 207 through the nozzle 205 and onto the substrate 5. In some other embodiments, the supply solution C3 is directly dispensed on the substrate 5 by another nozzle of the process module 20 different from the nozzle 205. The mixture M1 and the supply solution C3 are mixed on the substrate 5.

In some embodiments, the amount of the supply solution C3 supplied to the process module 20 per time period is identified in response to the flowing rate of the mixture M1 in the process module. For example, a higher flow rate of the mixture M1 in the inlet conduit 207 increases the amount of the supply solution C3 supplied and vice versa. As a result, the concentration of the substance in the adjusted mixture M2 is adjusted to the desired value.

It should be appreciated that many variations and modifications can be made to embodiments of the disclosure. In some embodiments, the mixture M1 is not dispensed on the substrate 5 unless the concentration of the substance meets the desired value. In some embodiments, operations 32-38 are performed simultaneously. The sensor 24 continuously detects the concentration of the substance in the mixture M1 and the amount of the supply solution C3 supplied to the process module 20 per time period is varied according to the detected results.

In some embodiments, when the system 10 is idle, i.e. the operations 33 and 34 are stopped, the operation 37 is not performed. The spiking process is performed during the supply of the mixture. In some embodiments, when the system 10 is idle, i.e. the operation 32 is still operated, and the operations 33 and 34 are stopped, the operation 37 is not performed. The operation 32 and the spiking process 37 are performed independently.

The method 30 continues with an operation 39 in which a processed solution M3 is drawn from the process module 20 to the storage module 12. In some embodiments, the processed solution M3 is drawn from the process module 20 to the storage module 12 via the outlet conduit 208 of the process module 20. The processed solution M3 may include the mixture M1, the supply solution C3, metal impurities from the substrate 5, and other contaminants in the process module 20.

Figure 3:
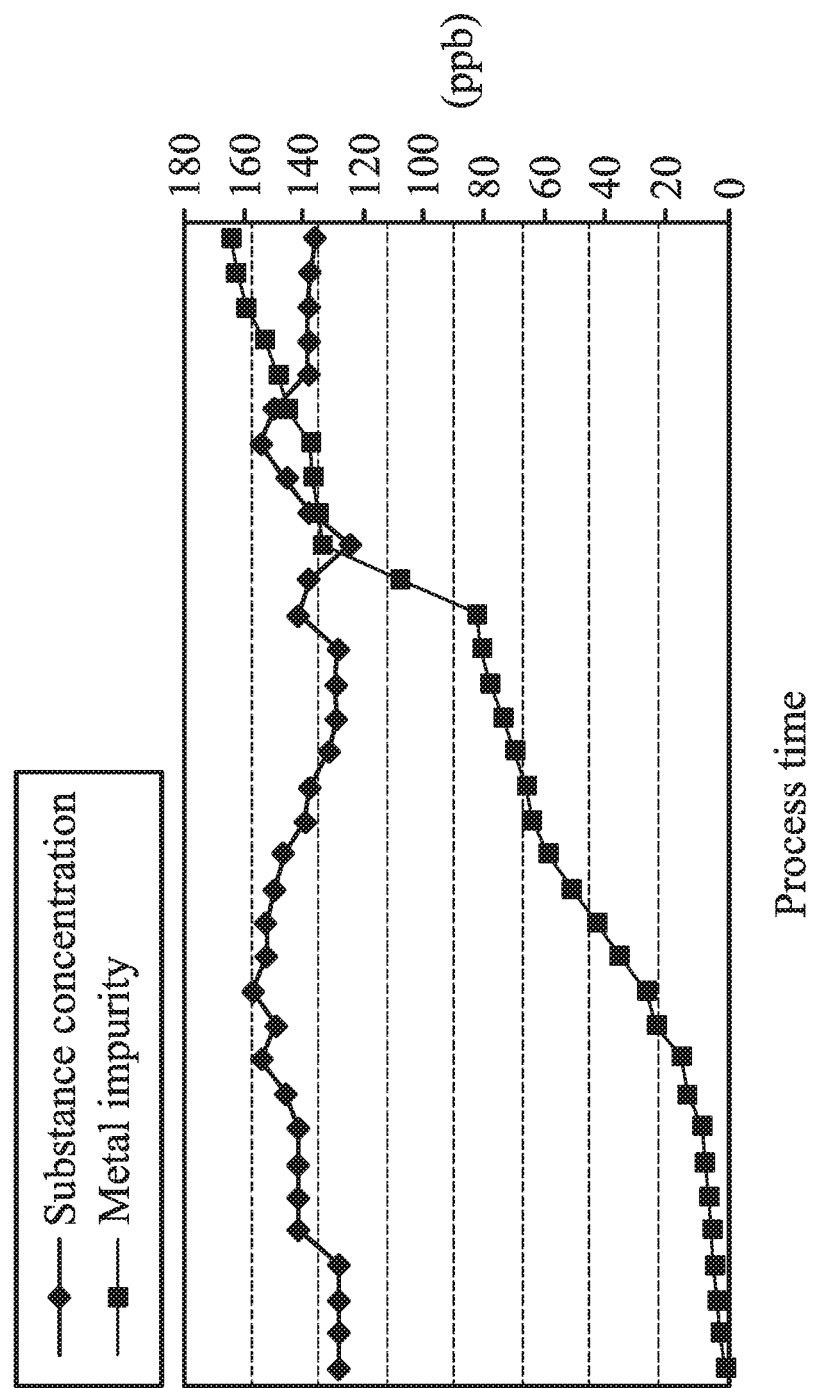
FIG. 3 shows variation in a concentration in unit of part per billion (ppb) of a substance and a metal impurity with an increase of processing time, in accordance with some embodiments.

Referring to FIG. 3, in some embodiments, as the processing time increases, more and more metal impurities from the process module 20 are added to the mixture M1 in the storage module 12, so therefore the level of the metal impurity in mixture M1 is increased. This change may expedite the reaction rate of the metal impurity and some substances in the mixture M1 and may cause poor processing performance. However, in this disclosure, by performing the spiking process, the concentration of the substance is substantially maintained at an accepted value, as shown in FIG. 3. The processing performance is maintained, and the product yield is increased.

In some embodiments, the level of the metal impurities is monitored, and a maintenance process is performed if the level of the metal impurities is higher than a limited value. In the maintenance process, the mixture is removed from the storage module 12. Afterwards, the operation 31 of the method is repeated.

It should be noted that because the spiking process is performed in the process module 20, the substrate 5 is always supplied with a substance having the correct concentration. Therefore, the mixture M1 can be reused for many times regardless of the increase in the level of the metal impurities. Therefore, the manufacturing cost is reduced.

Figure 4:
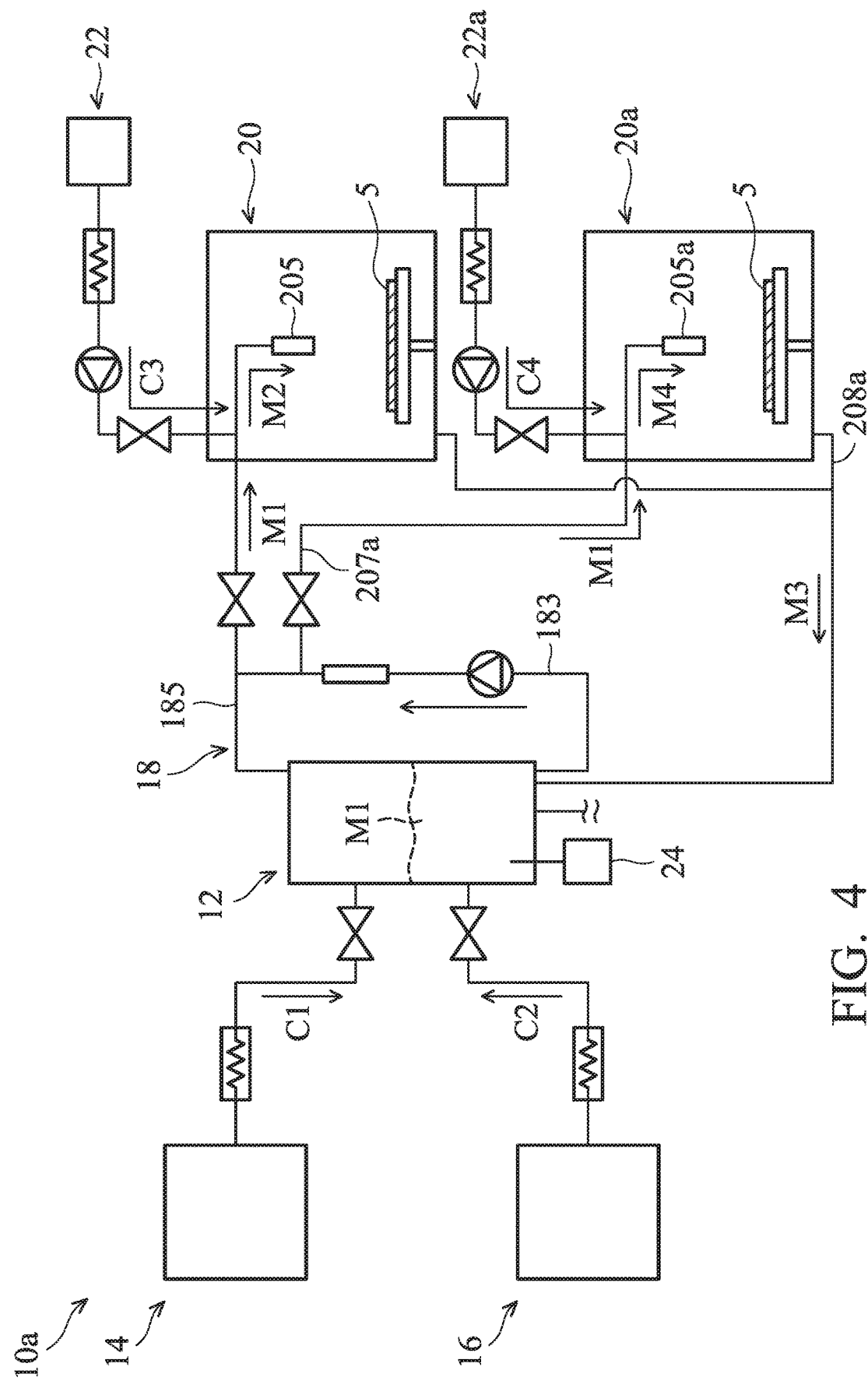
FIG. 4 shows a schematic view of a system for processing a substrate, in accordance with some embodiments.

FIG. 4 shows a system 10a for cleaning a number of the substrates 5. For brevity, structural features of the system 10a, which are the same as or similar to those of system 10, are not described herein in detail. In some embodiments, differences between the system 10a and the system 10 include the system 10a further including a process module 20a and a spiking module 22a.

In some embodiments, an inlet conduit 207a of the process module 20a is connected to the downstream conduit 185 of the circulation loop 18, and an outlet conduit of the process module 20a is connected to storage module 12. The spiking module 22a is connected to the inlet conduit 207a of the process module 20a to provide a supply solution C4 to the process module 20a.

Since each of the process modules 20 and 20a are connected to one of the spiking modules 22 and 22a, the spiking process is performed independently in the process modules 20 and 20a. For example, if the concentration of the substance detected by the sensor 24 is less than a desired value, the spiking module 22 supplies a supply solution C3 with a first substance to the process module 20, and the spiking module 22a supplies a supply solution C4 with a second substance to the process module 20. The supply solution C3 may be different from the supply solution C4. For example, the concentration of a particular substance in the supply solution C3 is different from that of the supply solution C4. Therefore, the two substrates respectively disposed in the two process modules 20 and 20a are supplied with different mixtures M2 and M4. The other operations for processing the substrates 5 by the system 10a are similar to the operations shown in method 30 of FIG. 2, the full description of which will not be repeated herein for brevity.

Figure 5:
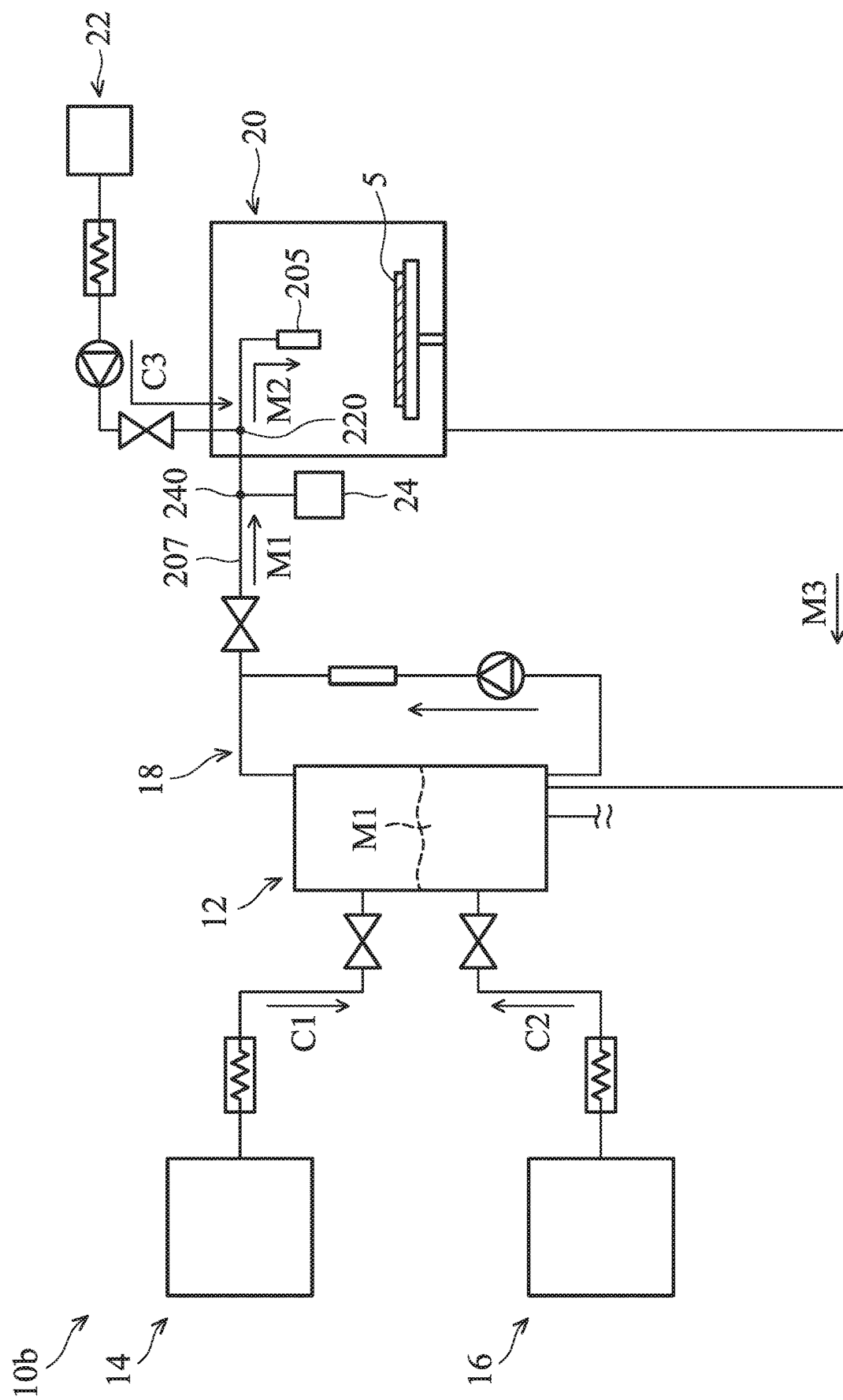
FIG. 5 shows a schematic view of a system for processing a substrate, in accordance with some embodiments.
Figures 1, 5:
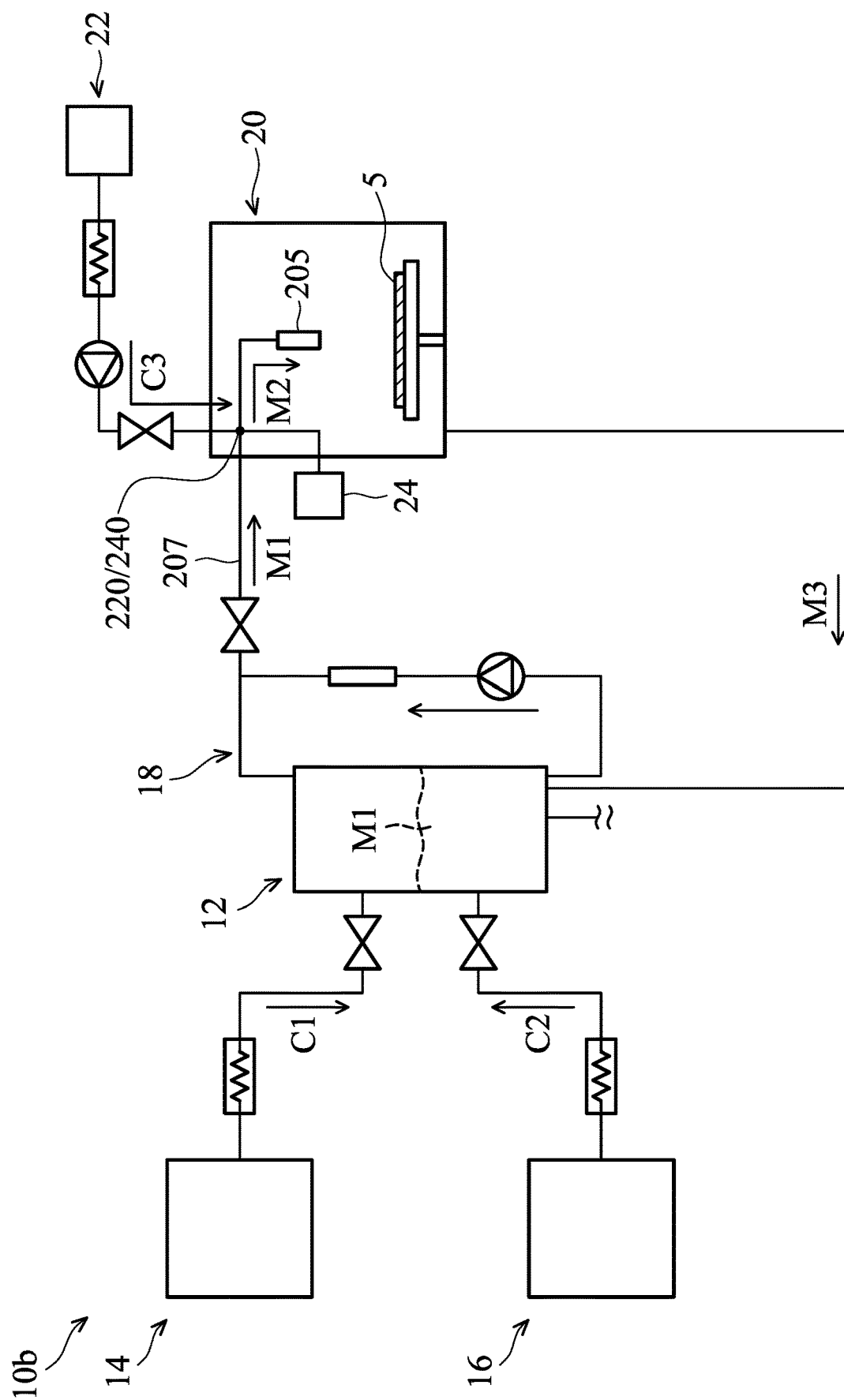

FIG. 5 shows a system 10b for processing the substrate 5. For brevity, structural features of the system 10b, which are the same as or similar to those of system 10, are not described herein in detail. In some embodiments, differences between the system 10b and the system 10 include the sensor 24 connecting to the process module 20.

In some embodiments, the sensor 24 is connected to the inlet conduit 207 of the process module 20. The sensor 24 is used to detect a concentration of the substance of the mixture M1 in the inlet conduit 207. In some embodiments, the spiking module 22 is connected to the inlet conduit 207 at a position 220, and the sensor 24 is connected to the inlet conduit 207 at a position 240. The position 220 is closer to the nozzle 205 than the position 240. As a result, the sensor 24 detects the concentration of the substance of the mixture M1 before the supply solution C3 is added into the mixture M1.

However, it should be appreciated that many variations and modifications can be made to embodiments of the disclosure. In some embodiments, the position 220 is aligned with the position 240, as shown in FIG. 5-1 (and in FIG. 6-1, where the reference numerals 220 and 240 are omitted). In some other embodiments, the system further includes an additional sensor connected to the inlet conduit in a position closer to the nozzle 205 than the position 220. The host computer analyzes the detected signals from the sensor 24 and the additional sensor to adjust the amount of supply solution C3 supplied to the process module 20.

In some embodiments, the conduit 207 of the process module 20 extends for a relative distance. While the mixture M1 is flowing from the storage module 12 to the position 240, the substance in the mixture M1 is decayed or reacted with the metal impurities in the mixture M1. This phenomena results a difference in the concentration of the substance in the storage module 12 and the position 240.

To solve the disadvantage mentioned above, the sensor 24 detects the concentration of the substance in the mixture M1 in the process module 20. That is the sensor 24 detects the concentration of the substance out of the circulation loop 18 or out of the storage module 12. For example, as shown in FIG. 5, the sensor 24 detects the concentration of the substance in position 240. As a result, the spiking module 22 is able to supply correct amount of the supply solution C3 into the process module 20, and the processing performance is accordingly improved. The other operations for process the substrates 5 by the system 10b are similar to the operations shown in method 30 of FIG. 2. The full operation of which will not be repeated herein for brevity.

Figure 6:
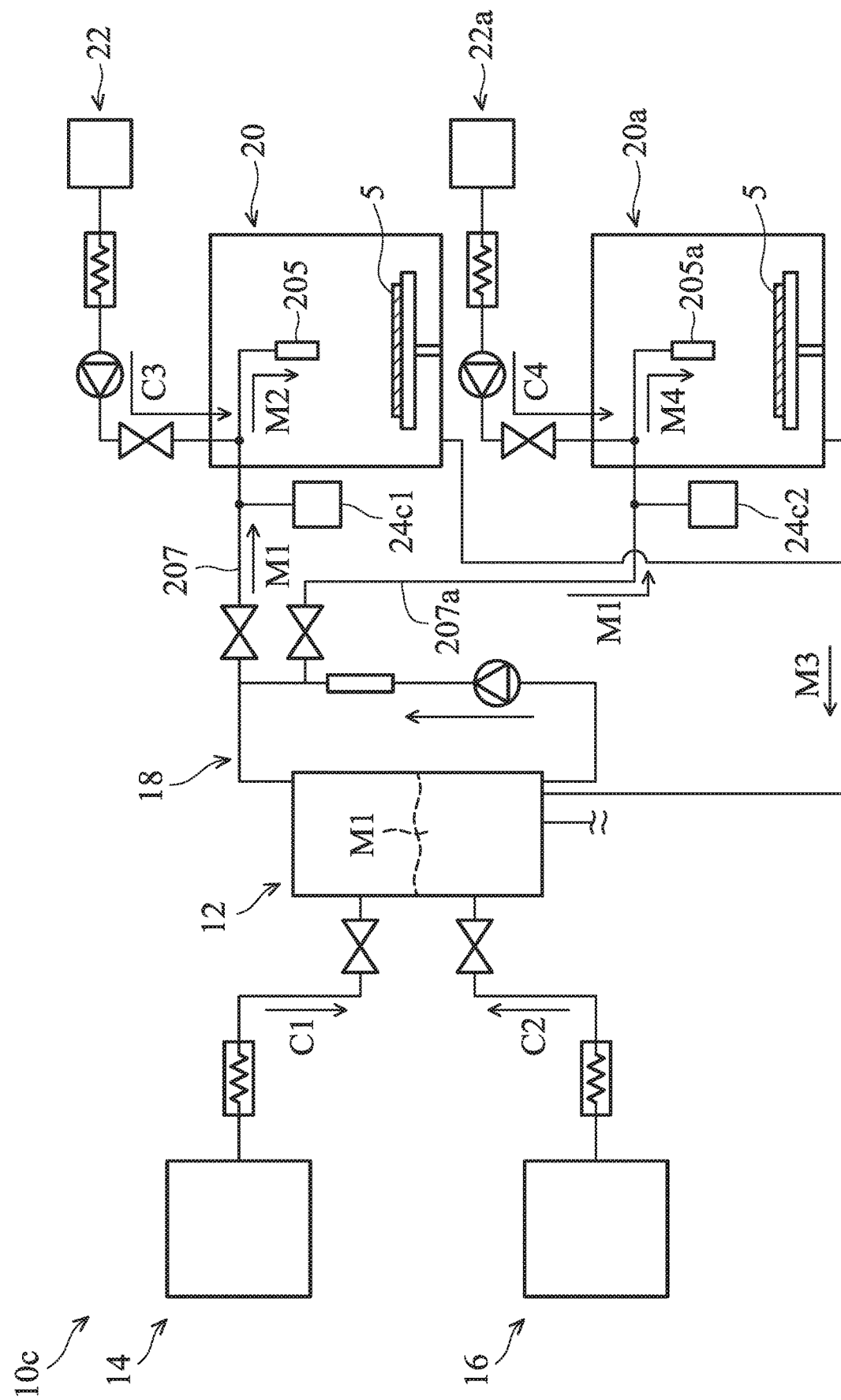
FIG. 6 shows a schematic view of a system for processing a substrate, in accordance with some embodiments.
Figures 1, 6:
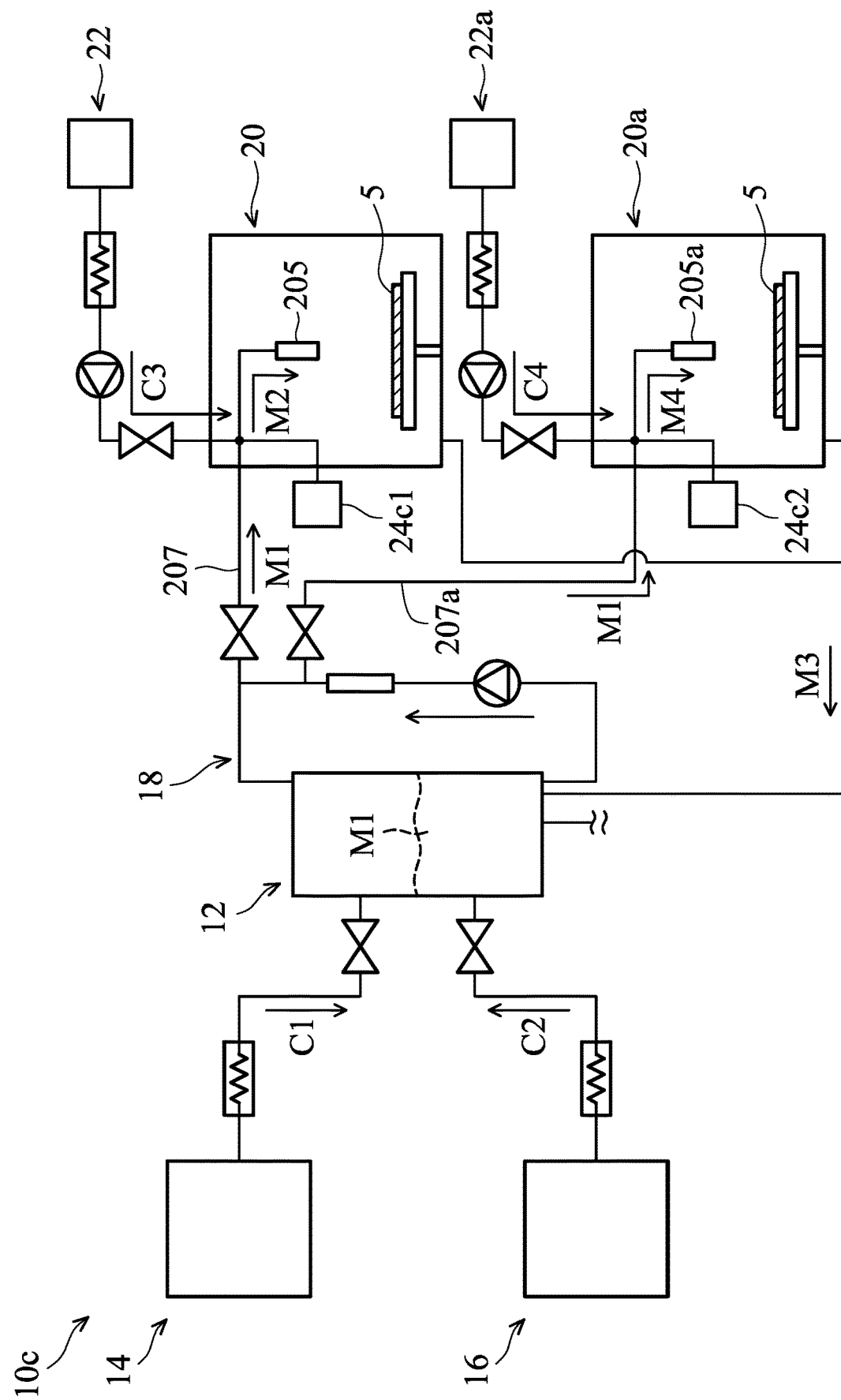

FIG. 6 shows a system 10c for processing a number of substrates 5. For brevity, structural features of the system 10c, which are the same as or similar to those of system 10a, are not described herein in detail. In some embodiments, differences between system 10a and system 10c include system 10c having a first sensor 24c1 and a second sensor 24c2.

The first sensor 24c1 and the second sensor 24c2 are respectively connected to the two process modules 20 and 20a. In some embodiments, the first sensor 24c1 is connected to the inlet conduit 207 of the process module 20 (hereinafter referred to as first process module). The second sensor 24c2 is connected to the inlet conduit 207a of the process module 20a (hereinafter referred to as second process module).

In some embodiments, to process the substrates 5, the mixture M1 is supplied into the inlet conduit 207 of the first process module 20 and the inlet conduit 207a of the second process module 20a. The first sensor 24c1 is used to detect a concentration of a first substance of the mixture M1 in the inlet conduit 207. The second sensor 24c2 is used to detect a concentration of a second substance of the mixture M1 in the inlet conduit 207a. The first substance may be the same or different from the second substance.

Method for processing the substrates 5 by the system 10c is described below. In some embodiments, if the concentration of the first substance of the mixture M1 in the first module 20 is less than a first desired value, the spiking module 22 (hereinafter referred to as first spiking module) supplies a supply solution C3 including the first substance to the first process module 20. After the supply solution C3 is added into the inlet conduit 207, an adjusted mixture M2 mixed with the supply solution C3 and the mixture M1 is provided. Afterwards, the adjusted mixture M2 is dispensed from the inlet conduit 207 through the nozzle 205 and onto the substrate 5 disposed in the first process module 20.

In some embodiments, if the concentration of the second substance of the mixture M1 in the second process module 20a is less than a second desired value, the spiking module 22a (hereinafter referred to as second spiking module) supplies a supply solution C4 including the second substance to the second process module 20a. After the supply solution C4 is added into the inlet conduit 207a, an adjusted mixture M4 mixed with the supply solution C4 and the mixture M1 is provided. Afterwards, the adjusted mixture M4 is dispensed from the inlet conduit 207a through the nozzle 205a and onto the substrate 5 disposed in the second process module 20a. The other operations for processing the substrates 5 by the system 10a are similar to the operations shown in method 30 of FIG. 2, the full operation of which will not be repeated herein for brevity.

In accordance with some embodiments, a system and methods for processing a substrate are provided. The methods involve detecting concentration of a substance in a mixture which is going to be supplied to the substrate, and selectively performing a spiking process to add the substance to the mixture. The added substance is supplied in a position in the process module and dispensed over the substrate very quickly after being mixed with the mixture. Chemical decay of the substance by time or metal impurities in the mixture is mitigated or avoided. Therefore, the substrate is processed by a solution with substances in the correct concentrations, and an outstanding profile or particle-removal capability is sustained. In addition, the processed solution from the process module can be reused to process the consequent substrate regardless of the increase of the metal impurity. The mixture is used for a long time period, and the manufacturing cost is reduced accordingly.

In accordance with some embodiments, a method of processing a substrate in semiconductor fabrication is provided. The method includes supplying a mixture from a storage module to a chamber via an inlet conduit. The method further includes detecting the concentration of a substance in the mixture. The method also includes dispensing the mixture over a substrate disposed in the chamber. In addition, the method includes supplying a supply solution including the substance to the chamber via the inlet conduit and dispensing the supply solution over the substrate when the concentration of the substance in the mixture is less than a desired value. The supply solution is supplied to the inlet conduit at a first position that is at a portion of the inlet conduit extending in the chamber In accordance with some embodiments, a system for processing a substrate in semiconductor fabrication is provided. The system includes a chamber used to receive the substrate. The system also includes a storage module used to supply a mixture to the process module via an inlet conduit connecting the storage module and the chamber. The system further includes a sensor used to detect the concentration of a substance in the mixture. In addition, the system includes a spiking module configured to dispense a supply solution including the substance to the process module when the concentration of the substance in the mixture is less than a desired value. The supply solution is supplied from the spiking module to the chamber via the inlet conduit, and the supply solution is supplied to the inlet conduit at a first position that is at a portion of the inlet conduit extending in the chamber.

In accordance with some embodiments, a system for processing a substrate in semiconductor fabrication is provided. The system includes a first chamber and a second chamber. Each of the first and the second chambers is used to receive at least one of the substrates. The system also includes a storage module configured to supply a mixture to the first and the second chambers via a first inlet conduit and a second inlet conduit, respectively. The system further includes at least one sensor used to detect a concentration of a first and a second substance in the mixture. In addition, the system includes a first and a second spiking module. The first spiking module connects to the first chamber and is used to dispense a first supply solution including the first substance to the first chamber when the concentration of the first substance in the mixture is less than a first desired value. The first supply solution is supplied from the first spiking module to the first chamber via the first inlet conduit, and the first supply solution is supplied to the first inlet conduit at a first position that is at a portion of the first inlet conduit extending in the first chamber. The second spiking module connects to the second chamber and is configured to dispense a second supply solution including the second substance to the second chamber when the concentration of the second substance in the mixture is less than a second desired value. The second supply solution is supplied from the second spiking module to the second chamber via the second inlet conduit, and the second supply solution is supplied to the second inlet conduit at a second position that is at a portion of the second inlet conduit extending in the second chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for processing a substrate in semiconductor fabrication, comprising:
   a chamber configured to receive the substrate, and a nozzle is disposed in the chamber;
   a storage module comprising a storage tank configured to store a mixture;
   a circulation loop configured to perform a circulation operation by drawing the mixture from the storage module and back into the storage module, wherein both ends of the circulation loop are directly connected to the storage tank;
   an inlet conduit configured to supply the mixture from the storage module to the nozzle, wherein the inlet conduit has a first end connected to the circulation loop and a second end connected to the nozzle;
   a first sensor, which is a concentration meter, configured to detect a concentration of a substance in the mixture in the inlet conduit, wherein the first sensor is connected to the inlet conduit at a first position which is downstream of the circulation loop and upstream of the nozzle;
   a spiking module comprising a supply solution tank and a branch conduit, configured to supply a supply solution including the substance to the chamber when the concentration of the substance in the mixture is less than a desired value;
   wherein the supply solution is supplied from the spiking module to the chamber via the inlet conduit, and the supply solution is supplied to the inlet conduit at a second position, wherein the second position is at a portion of the inlet conduit that extends in the chamber, and the first position is aligned with the second position;
   wherein the system also comprises a host computer configured to:
      analyze a signal transmitted from the first sensor to determine if the concentration of the substance in the mixture in the inlet conduit is less than the desired value; and
      control a valve on the branch conduit to supply the supply solution from the spiking module into the inlet conduit if the concentration of the substance is less than the desired value, so that an amount of the substance dispensed on the substrate is maintained at a target value;
   wherein the system further comprises a second sensor, which is a concentration meter, connected to the inlet conduit in a position closer to the nozzle than the first position; and
   wherein the host computer is configured to analyze the signal from the first sensor and a signal from the second sensor to adjust a volume of the supply solution supplied to the inlet conduit.

2. The system as claimed in claim 1, wherein the supply solution is supplied from the supply solution tank of the spiking module into the inlet conduit via the branch conduit, and the branch conduit is connected to the inlet conduit at the second position.

3. The system as claimed in claim 1, further comprising an outlet conduit connected to the chamber and configured to discharge the mixture in the chamber, wherein the outlet conduit is also connected to the storage tank and configured to drive the mixture in the chamber to the storage module, and
   wherein as the mixture in the chamber returns to the storage tank, a level of an impurity in the mixture in the storage tank is increased, while the amount of the substance dispensed on the substrate is maintained at the target value.

4. The system as claimed in claim 1, wherein the circulation loop comprises a filter configured to filter particles in the mixture.

5. A system for processing substrates in semiconductor fabrication, comprising:

a first chamber and a second chamber, wherein each of the first and second chambers is configured to receive at least one of the substrates;
a first nozzle and a second nozzle disposed in the first chamber and the second chamber, respectively;
a storage module comprising a storage tank configured to store a mixture;
a circulation loop configured to perform a circulation operation by drawing the mixture from the storage module and back into the storage module, wherein both ends of the circulation loop are directly connected to the storage tank;
a first inlet conduit configured to supply the mixture from the storage module to the first nozzle, wherein one end of the first inlet conduit is connected to the circulation loop, and the other end of the first inlet conduit is connected to the first nozzle;
a first outlet conduit connected to the first chamber, configured to discharge the mixture in the first chamber;
a second inlet conduit configured to supply the mixture from the storage module to the second nozzle, wherein one end of the second inlet conduit is connected to the circulation loop, and the other end of the second inlet conduit is connected to the second nozzle;
a second outlet conduit connected to the second chamber, configured to discharge the mixture in the second chamber;
a first sensor, which is a concentration meter, configured to detect a concentration of a first substance in the mixture in the first inlet conduit, wherein the first sensor is connected to the first inlet conduit at a first position and not to the first outlet conduit, and wherein the first position is downstream of the circulation loop and upstream of the first nozzle;
a second sensor, which is a concentration meter, configured to detect a concentration of a second substance in the mixture in the second inlet conduit, wherein the second sensor is connected to the second inlet conduit at a second position and not to the second outlet conduit, and wherein the second position is downstream of the circulation loop and upstream of the second nozzle;
a first spiking module comprising a first supply solution tank and a first branch conduit, wherein the first spiking module is configured to supply a first supply solution including the first substance to the first chamber when the concentration of the first substance in the mixture is less than a first desired value, wherein the first supply solution is supplied from the first spiking module to the first chamber via the first inlet conduit, and the first supply solution is supplied to the first inlet conduit at a third position, wherein the third position is at a portion of the first inlet conduit that extends in the first chamber, and the first position is aligned with the third position;
a second spiking module comprising a second supply solution tank and a second branch conduit, wherein the second spiking module is configured to supply a second supply solution including the second substance to the second chamber when the concentration of the second substance in the mixture is less than a second desired value, wherein the second supply solution is supplied from the second spiking module to the second chamber via the second inlet conduit, and the second supply solution is supplied to the second inlet conduit at a fourth position, wherein the fourth position is at a portion of the second inlet conduit that extends in the second chamber, and the second position is aligned with the fourth position;
wherein the system also comprises a host computer configured to:
analyze a signal transmitted from the first sensor to determine if the concentration of the first substance in the mixture in the first inlet conduit is less than the first desired value;
control a valve on the first branch conduit to supply the first supply solution from the first spiking module into the first inlet conduit if the concentration of the first substance is less than the first desired value, so that an amount of the first substance dispensed on a substrate in the first chamber is maintained at a first target value;
analyze a signal transmitted from the second sensor to determine if the concentration of the second substance in the mixture in the second inlet conduit is less than the second desired value; and
control a valve on the second branch conduit to supply the second supply solution from the second spiking module into the second inlet conduit if the concentration of the second substance is less than the second desired value, so that an amount of the second substance dispensed on a substrate in the second chamber is maintained at a second target value;
wherein the system further comprises:
a third sensor, which is a concentration meter, connected to the first inlet conduit in a position closer to the first nozzle than the first position,
a fourth sensor, which is a concentration meter, connected to the second inlet conduit in a position closer to the second nozzle than the second position; and
wherein the host computer is configured to analyze the signal from the first sensor and a signal from the third sensor to adjust a volume of the first supply solution supplied to the first inlet conduit, and configured to analyze the signal from the second sensor and a signal from the fourth sensor to adjust a volume of the second supply solution supplied to the second inlet conduit.

6. The system as claimed in claim 5, wherein the first outlet conduit is also connected to the storage tank and configured to drive the mixture in the first chamber to the storage module, and wherein the second outlet conduit is also connected to the storage tank and configured to drive the mixture in the second chamber to the storage module.

7. The system as claimed in claim 5, wherein the first substance is different from the second substance.

8. A system for processing a substrate in semiconductor fabrication, comprising:
a chamber configured to receive the substrate, and a nozzle is disposed in the chamber;
a storage module comprising a storage tank configured to store a mixture;
a circulation loop configured to perform a circulation operation by drawing the mixture from the storage module and back into the storage module, wherein both ends of the circulation loop are directly connected to the storage tank;
an inlet conduit configured to supply the mixture from the storage module to the nozzle, wherein the inlet conduit has a first end connected to the circulation loop and a second end connected to the nozzle;
an outlet conduit connected to the chamber, configured to discharge the mixture in the chamber;

a first sensor, which is a concentration meter, configured to detect a concentration of a substance in the mixture in the inlet conduit, wherein the first sensor is connected to the inlet conduit at a first position and not to the outlet conduit, and wherein the first position is downstream of the circulation loop and up stream of the nozzle;

a spiking module comprising a supply solution tank and a branch conduit, configured to supply a supply solution including the substance to the chamber when the concentration of the substance in the mixture is less than a desired value;

wherein the supply solution is supplied from the spiking module to the chamber via the inlet conduit, and the supply solution is supplied to the inlet conduit at a second position, wherein the second position is at a portion of the inlet conduit that extends in the chamber, and the first position and the second position are the same position on the inlet conduit;

wherein the system also comprises a host computer configured to:
  analyze a signal transmitted from the first sensor to determine if the concentration of the substance in the mixture in the inlet conduit is less than the desired value: and
  control a valve on the branch conduit to supply the supply solution from the spiking module into the inlet conduit if the concentration of the substance is less than the desired value, so that an amount of the substance dispensed on the substrate is maintained at a target value;

wherein the system further comprises a second sensor, which is a concentration meter, connected to the inlet conduit in a position closer to the nozzle than the first position; and wherein the host computer is configured to analyze the signal from the first sensor and a signal from the second sensor to adjust a volume of the supply solution supplied to the inlet conduit.

9. The system as claimed in claim 8, wherein the supply solution is supplied from the supply solution tank of the spiking module into the inlet conduit via the branch conduit, and the branch conduit is connected to the inlet conduit at the second position.

10. The system as claimed in claim 9, wherein the branch conduit comprises a heater configured to heat the supply solution.

11. The system as claimed in claim 8, wherein the supply solution is supplied from the spiking module to the chamber while the mixture is supplied from the storage module to the chamber.

12. The system as claimed in claim 8, wherein an volume of the supply solution supplied to the inlet conduit per time period is identified in response to a flowing rate of the mixture in the inlet conduit.

13. The system as claimed in claim 8, wherein the supply solution is supplied into the inlet conduit before the mixture is dispensed over the substrate, and the mixture and the supply solution are together dispensed over the substrate via the inlet conduit.

14. The system as claimed in claim 8, wherein the concentration of the substance in the mixture is continuously detected by the first sensor, and the volume of the supply solution supplied to the chamber is varied according to real-time detected results of the first sensor.

15. The system as claimed in claim 8, wherein the outlet conduit is also connected to the storage tank and configured to drive the mixture in the chamber to the storage module.

16. The system as claimed in claim 8, wherein the circulation loop comprises a filter configured to filter particles in the mixture.

17. The system as claimed in claim 1, further comprising a valve disposed on the inlet conduit and configured to regulate a flow of the mixture from the circulation loop to the nozzle.

18. The system as claimed in claim 1, wherein the supply solution is supplied from the spiking module to the chamber while the mixture is supplied from the storage module to the chamber.

19. The system as claimed in claim 2, wherein the branch conduit comprises a heater configured to heat the supply solution.

20. The system as claimed in claim 8, further comprising a valve disposed on the inlet conduit and configured to regulate a flow of the mixture from the circulation loop to the nozzle.

* * * * *